(12) United States Patent
Yajima (10) Patent No.: US 7,834,710 B2
(45) Date of Patent: Nov. 16, 2010

(54) OSCILLATOR CIRCUIT AND ELECTRONIC DEVICE HAVING OSCILLATOR CIRCUIT

(75) Inventor: Aritsugu Yajima, Suwa (JP)

(73) Assignee: Seiko Epson Corporation, Shinjuku-ku, Tokyo (JP)

( * ) Notice: Subject to any disclaimer, the term of this patent is extended or adjusted under 35 U.S.C. 154(b) by 13 days.

(21) Appl. No.: 12/204,457

(22) Filed: Sep. 4, 2008

(65) Prior Publication Data

US 2009/0058546 A1 Mar. 5, 2009

(30) Foreign Application Priority Data

Sep. 5, 2007 (JP) ............................. 2007-229817
Jul. 22, 2008 (JP) ............................. 2008-188175

(51) Int. Cl.
*H03B 5/30* (2006.01)
(52) U.S. Cl. ................................. 331/116 FE; 331/158
(58) Field of Classification Search ................. 331/158, 331/116 FE
See application file for complete search history.

(56) References Cited

U.S. PATENT DOCUMENTS 7,034,628 B1* 4/2006 Lu et al. ..................... 331/158
7,183,868 B1* 2/2007 Wessendorf ................ 331/158
7,411,466 B2* 8/2008 Alford ........................ 331/158
2002/0125965 A1* 9/2002 Hasegawa et al. ........... 331/158

FOREIGN PATENT DOCUMENTS

| JP | 3229900 B | 11/2001 |
| JP | 2002-204128 | 7/2002 |
| JP | 2003-008359 | 1/2003 |
| JP | 2005-086664 | 3/2005 |
| JP | 2007-221197 | 8/2007 |

* cited by examiner

*Primary Examiner*—Joseph Chang
(74) *Attorney, Agent, or Firm*—Townsend and Townsend and Crew LLP (57) ABSTRACT

An oscillator circuit includes a first terminal, a second terminal, a resonator that is connected to the first terminal and the second terminal, a first capacitor that is connected to the first terminal and a ground line supplying the ground electric potential, a second capacitor that is connected to the second terminal and the ground line, m inverters, where m is an odd number equal to or larger than three, which are connected in series between the first terminal and the second terminal, and a third capacitor that is connected to an input terminal of the n-th (where n is an integer satisfying $1 \leq n < m$) inverter, counted from an input side of the inverter array and an output terminal of the (n+1)-th inverter.

4 Claims, 12 Drawing Sheets

OSCILLATOR CIRCUIT AND ELECTRONIC DEVICE HAVING OSCILLATOR CIRCUIT

CROSS-REFERENCES TO RELATED APPLICATIONS

This application claims priority to Japanese Patent Application No. 2007-229817, filed Sep. 5, 2007, and Japanese Patent Application No. 2008-188175, filed Jul. 22, 2008, the disclosures of which are incorporated by reference herein, in their entirety and for all purposes.

BACKGROUND

1. Technical Field

The present invention relates to an oscillator circuit using a resonator and an electronic device having the oscillator circuit.

2. Related Art

In electronic devices such as computers, a demand for increasing the operating speed has increased every year. The above-described electronic devices control operating timings of circuits of each unit by using a clock signal that is generated by a built-in oscillator circuit. Thus, in order to increase the operating speed of the electronic devices, the oscillating frequency of the oscillator circuit is needed to increase. For example, in Japanese Patent No. 3,229,900, a third-order over-tone oscillator circuit of which activation for oscillation is improved by increasing the amplification factor of an inverted amplifier has been disclosed.

However, in a general method, negative resistance decreases due to a parasitic component of a MOS transistor that constitutes an inverter. Thus, there is a problem that power consumption increases for acquiring desired negative resistance.

SUMMARY

An advantage of some aspects of the invention is that it provides an oscillator circuit using a resonator and an electronic device having the oscillator circuit. The invention can be implemented as the following forms or aspects.

First Aspect

According to a first aspect of the invention, there is provided an oscillator circuit including: a first terminal; a second terminal; a resonator that is the first terminal and the second terminal; a first capacitor that is connected to the first terminal and a ground line supplying the ground electric potential; a second capacitor that is connected to the second terminal and the ground line, m inverters, where m is an odd number equal to or larger than three, which are connected in series between the first terminal and the second terminal; and a third capacitor that is connected to an input terminal of the n-th (where n is an integer satisfying $1 \leq n < m$) inverter, counted from an input side of the inverter array and an output terminal of the (n+1)-th inverter.

According to the above-described oscillator circuit, by connecting the third capacitor between the input terminal of the n-th inverter and the output terminal of the (n+1)-th inverter for applying feedback, an additional oscillating loop in addition to the oscillating loop configured by the m inverters and the oscillator is formed. Accordingly, a blocking factor for the negative resistance decreases, and thereby low power consumption can be implemented.

Second Aspect

According to a second aspect of the invention, the above-described oscillator circuit further includes a fourth capacitor connected to the p-th (where p is an integer other than n satisfying $1 \leq p < m$) inverter, counted from the input side of the inverter array and an output terminal of the (p+1)-th inverter.

According to the above-described oscillator circuit, by additionally connecting the fourth capacitor between the input terminal of the p-th inverter and the output terminal of the (p+1)-th inverter for applying feedback, the negative resistance decreases further, and thereby the lower power consumption can be implemented.

Third Aspect

According to a third aspect of the invention, in the above-described oscillator circuit, the m inverters respectively include a first active element and a second active element that have drain terminals connected to each other, a source terminal of the first active element is connected to the ground line through a first load element that is a load element formed by connecting a resistor and a capacitor in parallel with each other, and a source terminal of the second active element is connected to a voltage source line that supplies a source voltage through a second load element that is the load element.

According to the above-described oscillator circuit, by adding the resistor, a current flowing through the inverter can be suppressed. Accordingly, by adding the capacitor, the AC gain of the circuit increases, and thereby a blocking factor for the negative resistance decreases. As a result, high negative resistance can be maintained, and thereby low power consumption can be implemented.

Fourth Aspect

According to a fourth aspect of the invention, in the above-described oscillator circuit, the m inverters respectively include a first active element and a second active element that have drain terminals connected to each other, a source terminal of the first active element is connected to the ground line through a first load element that is a load element formed by connecting an inductor and a capacitor in parallel with each other, and a source terminal of the second active element is connected to a voltage source line that supplies a source voltage through a second load element that is the load element.

According to the above-described oscillator circuit, by adding the inductor, a current flowing through the inverter can be suppressed. Accordingly, by adding the capacitor, the AC gain of the circuit increases, and thereby a blocking factor for the negative resistance decreases. As a result, high negative resistance can be maintained, and thereby low power consumption can be implemented.

Fifth Aspect

According to a fifth aspect of the invention, there is provided an electronic device including any one of the above-described oscillator circuits. In addition, the electronic device is controlled based on a signal output from the first or second terminal of the oscillator circuit.

According to the above-described electronic device, an electronic device having low power consumption can be implemented.

BRIEF DESCRIPTION OF THE DRAWINGS

The invention will be described with reference to the accompanying drawings, wherein like numbers reference like elements.

DESCRIPTION OF THE EXEMPLARY EMBODIMENTS

Hereinafter, oscillator circuits according to embodiments of the invention will be described.

First Embodiment

Configuration of Oscillator Circuit

Figure 1:
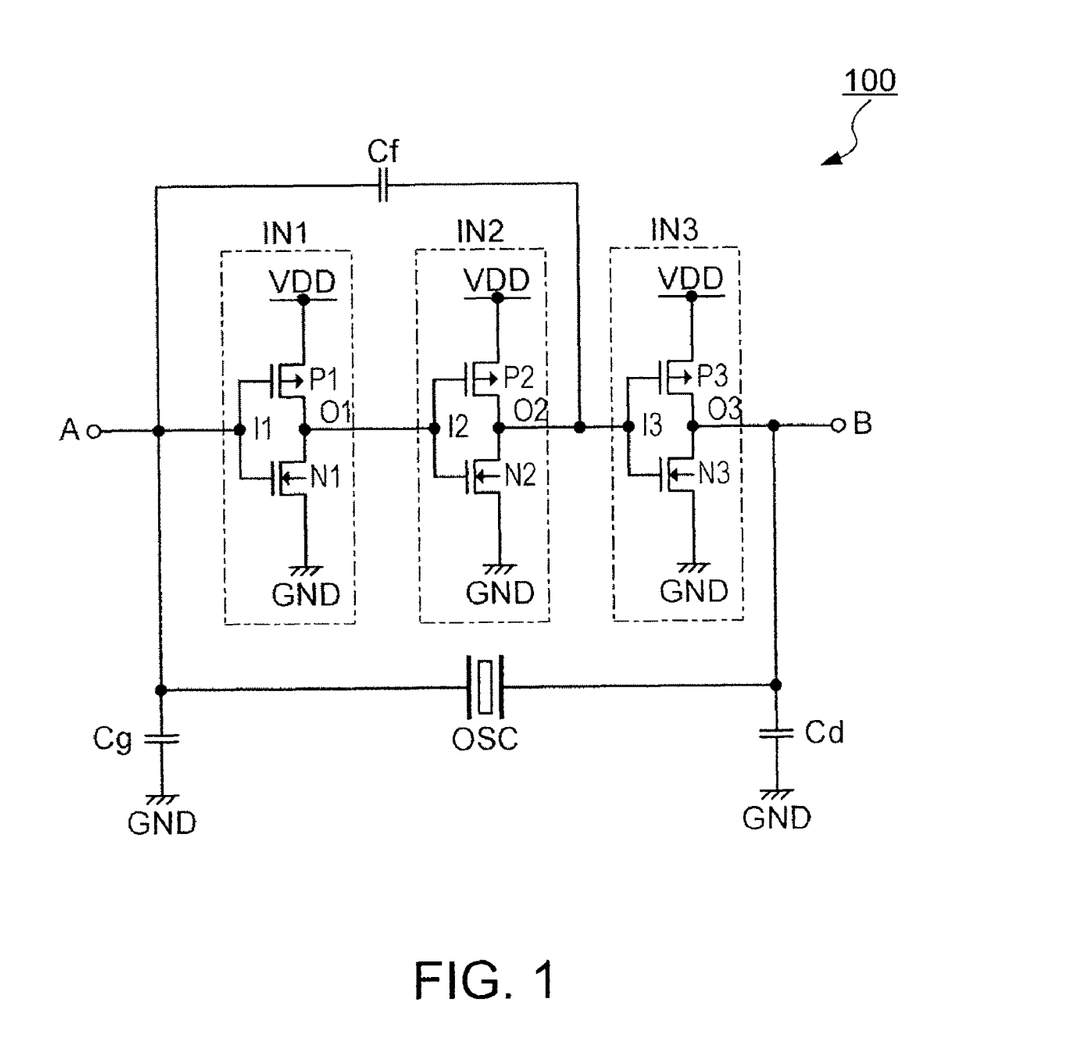
FIG. 1 is a circuit diagram showing the configuration of an oscillator circuit according to a first embodiment.

First, the configuration of an oscillator circuit according to a first embodiment of the invention will be described with reference to FIG. 1. FIG. 1 is a circuit diagram showing the configuration of an oscillator circuit according to the first embodiment.

As shown in FIG. 1, the oscillator circuit 100 includes a first terminal A, a second terminal B, an resonator OSC that is configured by a SAW (Surface Acoustic Wave) resonator or the like connected to the first terminal A and the second terminal B, a first capacitor Cg that is connected to the first terminal A and a ground line GND that supplies the ground electric potential, a second capacitor Cd that is connected to the second terminal B and the ground line GND, three (m=3) inverters IN1 to IN3 that are connected in series between the first terminal A and the second terminal B, and a third capacitor Cf that is connected to an input terminal I1 of a first (n=1) inverter IN1 and an output terminal O2 of a second (n+1=1+1) inverter IN2.

The inverter IN1 is configured by an N-channel transistor N1, which is a first active element, and a P-channel transistor P1, which is a second active element, connected in series between the ground line GND and a voltage source line VDD that supplies a source voltage. The inverter IN2 is configured by an N-channel transistor N2 and a P-channel transistor P2 that are connected in series between the ground line GND and the voltage source line VDD. In addition, the inverter IN3 is configured by an N-channel transistor N3 and a P-channel transistor P3 that are connected in series between the ground line GND and the voltage source line VDD.

Here, a principle for reducing a blocking factor for negative resistance by connecting the third capacitor Cf between the input terminal I1 of the inverter IN1 and the output terminal O2 of the inverter IN2 will be described.

Figure 5:
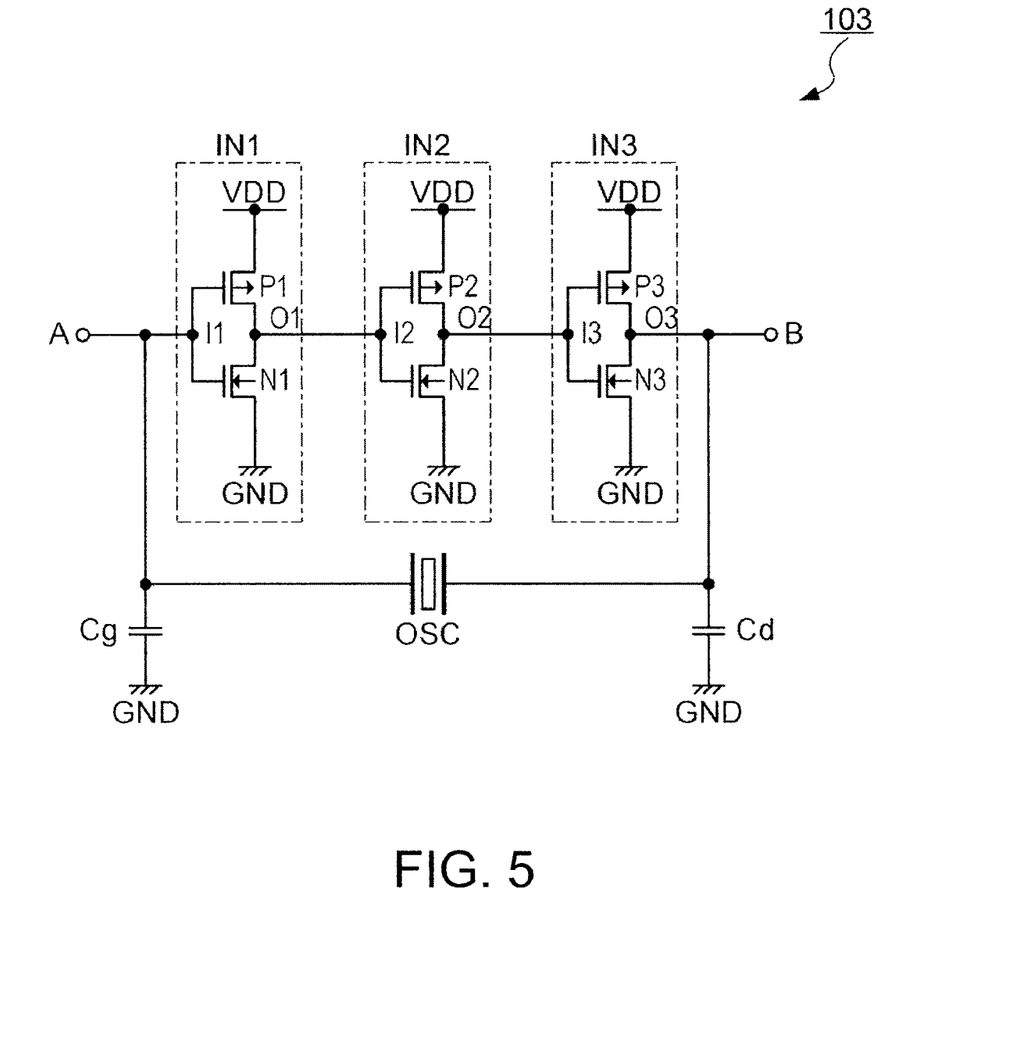
FIG. 5 is a circuit diagram showing the configuration of a general oscillator circuit.

FIG. 5 is a circuit diagram showing the configuration of a general oscillator circuit 103. As shown in FIG. 5, in the general oscillator circuit 103, a third capacitor Cf that is connected to the input terminal I1 of the inverter IN1 and the output terminal O2 of the inverter IN2, which is included in the oscillator circuit 100 shown in FIG. 1, is not included.

Figure 6:
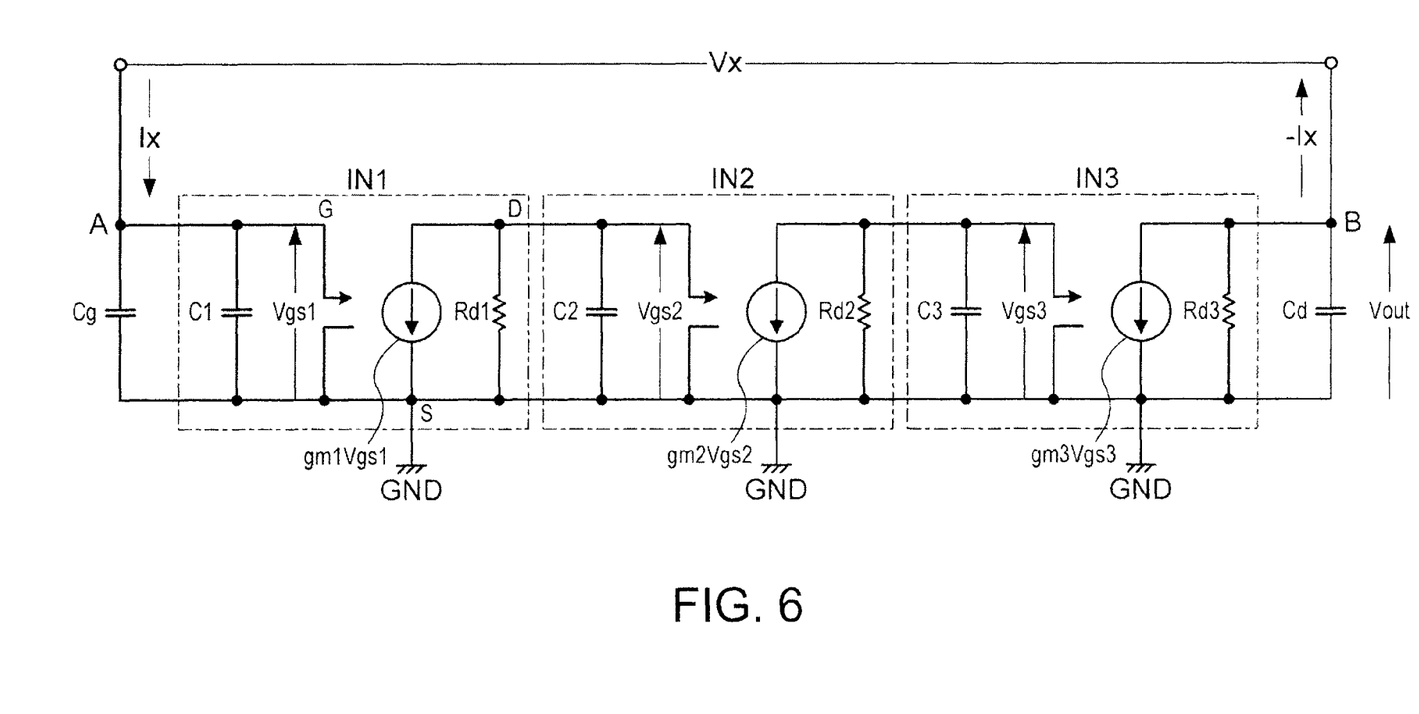
FIG. 6 is an equivalent circuit diagram for three inverters included in a general oscillator circuit.

FIG. 6 is an equivalent circuit diagram for three inverters included in the general oscillator circuit 103. The N-channel transistor N1 and the P-channel transistor P1 that constitute the inverter IN1 are AC-equivalent to the voltage source line VDD and the ground line GND. Thus, as shown in FIG. 6, the inverter IN1 can be substituted with a voltage-controlled current source gm1Vgs1, a drain resistor Rd1, and a capacitor C1 having capacitance acquired from summing gate-source capacitance and gate-to-drain capacitance. The inverter IN2 can be substituted with a voltage-controlled current source gm2Vgs2, a drain resistor Rd2, and a capacitor C2. In addition, the inverter IN3 can be substituted with a voltage-controlled current source gm3Vgs3, a drain resistor Rd3, and a capacitor C3.

By solving nodal equations of Kirchhoff's laws between a first terminal A and a second terminal B, currents Ix flowing through the three inverters IN1 to IN3 can be acquired by the following equation (1).

$$Ix = j\omega(C1+Cg) \times Vgs1 = Ya \times Vgs1 \qquad (1)$$

Here, admittance Ya of (C1+Cg) can be acquired from $Ya = j\omega(C1+Cg)$. In addition, Vgs1 is a gate-to-source voltage of the inverter IN1.

Next, a gate-to-source voltage Vgs2 of the inverter IN2 can be acquired from the following equation (2).

$$Vgs2 = -gm1 \times Vgs1 \times Rd1/(1+Rd1 \times Y2) \qquad (2)$$

Here, admittance Y2 of C2 can be acquired from $Y2 = j\omega C2$.

Similarly, a gate-to-source voltage Vgs3 of the inverter IN3 can be acquired from the following equation (3).

$$Vgs3 = -gm2 \times Vgs2 \times Rd2/(1+Rd2 \times Y3) \qquad (3)$$

Here, admittance Y3 of C3 can be acquired from $Y3 = j\omega C3$.

In addition, a voltage Vout that is applied to a second capacitor Cd can be acquired from the following equation (4).

$$Vout = (Ix + gm3 \times Vgs3) \times Rd3/(1+Rd3 \times Yd) \qquad (4)$$

Here, admittance Yd of the second capacitor Cd can be acquired from $Yd = j\omega Cd$.

By substituting the equations (2) and (3) into the equation (4), a voltage Vout can be acquired from the following equation (5).

$$Vout = -\{Ix + gm1 \times gm2 \times gm3 \times ((Rd1 \times Rd2 \times Vgs1)/(1+Rd1 \times Y2) \times (1+Rd2 \times Y3))\} \times (Rd3/(1+Rd3 \times Yd)) \qquad (5)$$

When negative resistance $-Rx0$ of the three inverters IN1 to IN3 is acquired from the equation (5) by substituting $Vgs1 = Ix/Ya$ in the equation (1) with a gain factor $Gm = gm1 \times gm2 \times gm3$ and resistance $Rd = Rd1 \times Rd2 \times Rd3$, the negative resistance $-Rx0$ is represented by the following equation (6).

$$-Rx0 = (1/Ya) + \{Rd3/(1+Rd3 \times Yd)\} + \{Gm \times Rd/(Ya \times (1+Rd1 \times Y2) \times (1+Rd2 \times Y3) \times (1+Rd3 \times Yd))\} \qquad (6)$$

When taking a real part from the equation (6) by excluding an imaginary part, an equation for the negative resistance shown in the following equation (7) can be acquired.

$$-Rx0=\{(-gm1)/(\omega^2\times(Cg+C1)\times Cd)\}\times\{(gm2\times Rd1)/(1+(\omega\times C2\times Rd1)^2)\}\times\{(gm3\times Rd2)/(1+(\omega\times C3\times Rd2)^2)\}\times\{1/(1+(1/(\omega\times Cd\times Rd3)^2))+{Rd3/(1+(\omega\times Cd\times Rd3)^2)}\} \quad (7)$$

Figure 2:
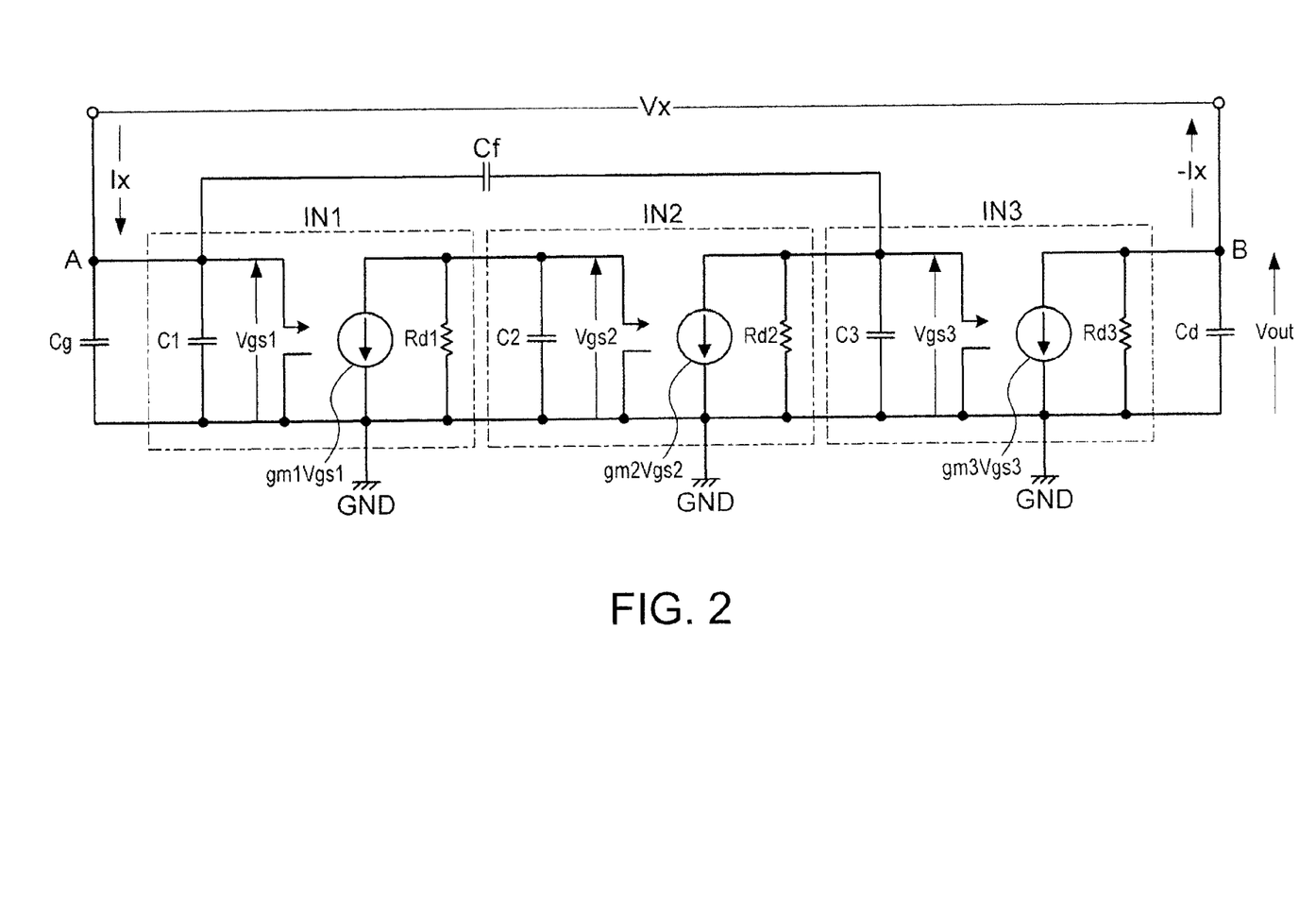
FIG. 2 is an equivalent circuit diagram for three inverters and a capacitor that are included in the oscillator circuit shown in FIG. 1.

FIG. 2 is an equivalent circuit diagram for three inverters IN1 to IN3 and the third capacitor Cf that are included in the oscillator circuit 100 shown in FIG. 1. Since the third capacitor Cf connected to the input terminal I1 of the inverter IN1 and the output terminal O2 of the inverter IN2 is added to the equivalent circuit of the general oscillator circuit shown in FIG. 6, the negative resistance −Rx of the three inverters IN1 to IN3 of the oscillator circuit 100 can be represented by the following equation (8).

$$-Rx=\{(-gm1)/(\omega^2\times(Cg+C1-Cf)\times Cd)\}\times\{(gm2\times Rd1)/(1+(\omega\times C2\times Rd1)^2)\}\times\{(gm3\times Rd2)/(1+(\omega\times C3\times Rd2)^2)\}\times\{1/(1+(1/(\omega\times Cd\times Rd3)^2))+{Rd3/(1+(\omega\times Cd\times Rd3)^2)}\} \quad (8)$$

In other words, the denominator of the equation (8) becomes (Cg+C1−Cf) that is smaller than the denominator (Cg+C1) of the equation (7), and accordingly, the negative resistance −Rx of the oscillator circuit 100 increases.

According to the above-described embodiment, the following advantages can be acquired.

In this embodiment, an additional oscillating loop in addition to the oscillating loop configured by the three inverters IN1 to IN3 and the resonator OSC is formed by connecting the third capacitor Cf between the input terminal I1 of the first inverter IN1 and the output terminal O2 of the second inverter IN2 for applying feedback. Accordingly, a blocking factor for the negative resistance decreases, and thereby low power consumption can be implemented.

MODIFIED EXAMPLE 1

Hereinafter, Modified Example 1 of the oscillator circuit will be described. According to the first embodiment, in the three inverters IN1 to IN3 of the oscillator circuit 100, the feedback is applied by connecting the third capacitor Cf between the input terminal I1 of the first inverter IN1 and the output terminal O2 of the second inverter IN2. However, a capacitor for another feedback may be added. For example, for the oscillator circuit 100 shown in FIG. 1, an additional fourth capacitor may be connected to an input terminal I2 of the second inverter IN2 and an output terminal O3 of the third inverter IN3 for applying feedback. In such a case, the denominator of the equation (8) becomes much smaller, and thus, the negative resistance −Rx increases. Under the configuration described above, a blocking factor for the negative resistance decreases, and thereby low power consumption can be implemented.

Figure 3:
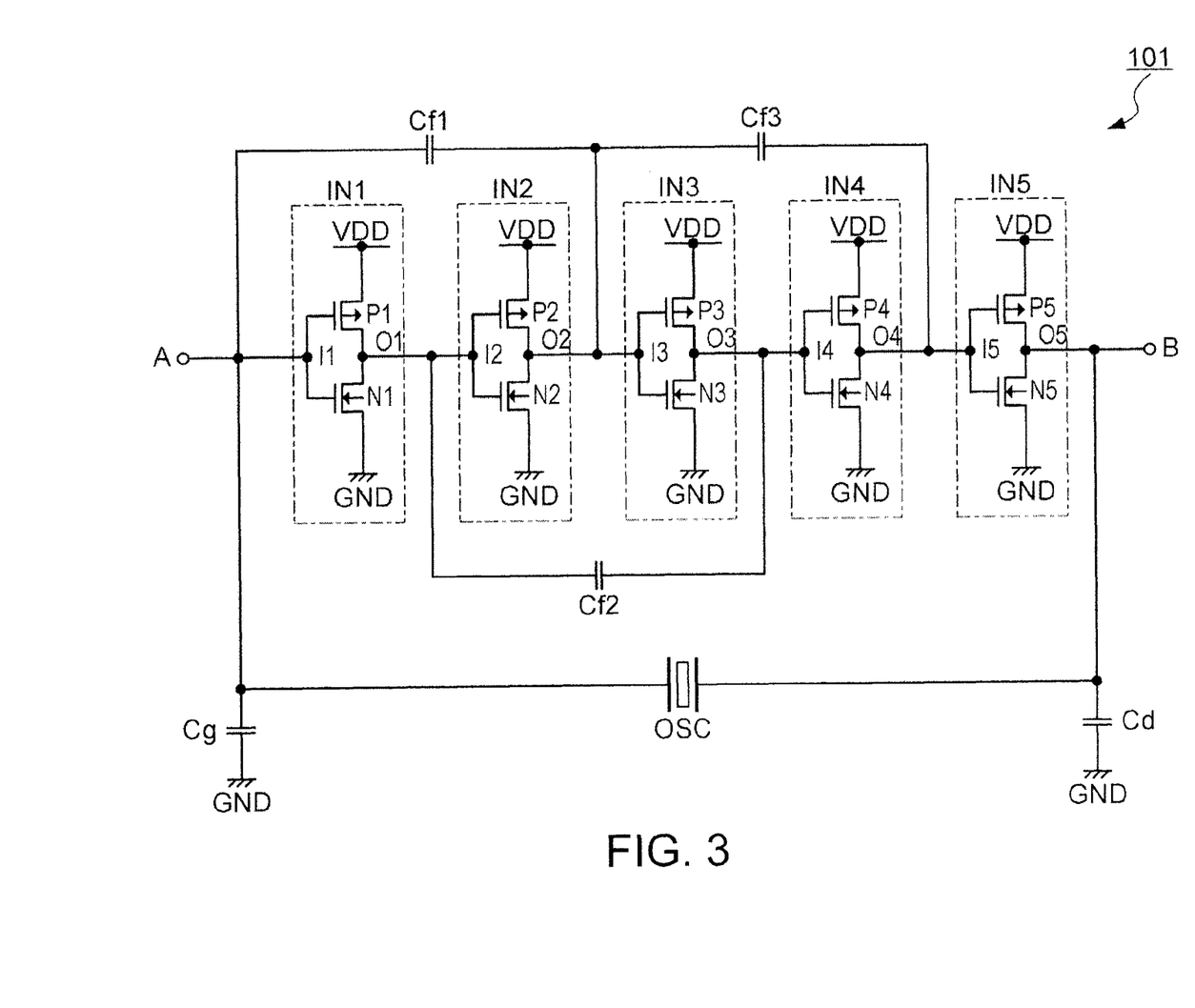
FIG. 3 is a circuit diagram showing the configuration of an oscillator circuit according to Modified Example 1.

In addition, although a case where three (m=3) inverters are included has been described in the first embodiment, the number of the inverters may be three or more. FIG. 3 is a circuit diagram showing the configuration of an oscillator circuit 101 according to Modified Example 1. As shown in FIG. 3, the oscillator circuit 101 includes five inverters IN1 to IN5. In addition, a third capacitor Cf1 is connected to an input terminal I1 of a first inverter IN1 and an output terminal O2 of a second inverter IN2, a fourth capacitor Cf2 is connected to an input terminal I2 of the second inverter IN2 and an output terminal O3 of a third inverter IN3, and a fifth capacitor Cf3 is connected to an input terminal I3 of the third inverter IN3 and an output terminal O4 of a fourth inverter IN4. Under the configuration described above, the negative resistance −Rx increases, and thus, a blocking factor for the negative resistance decreases. Therefore, low power consumption can be implemented.

MODIFIED EXAMPLE 2

Figure 4:
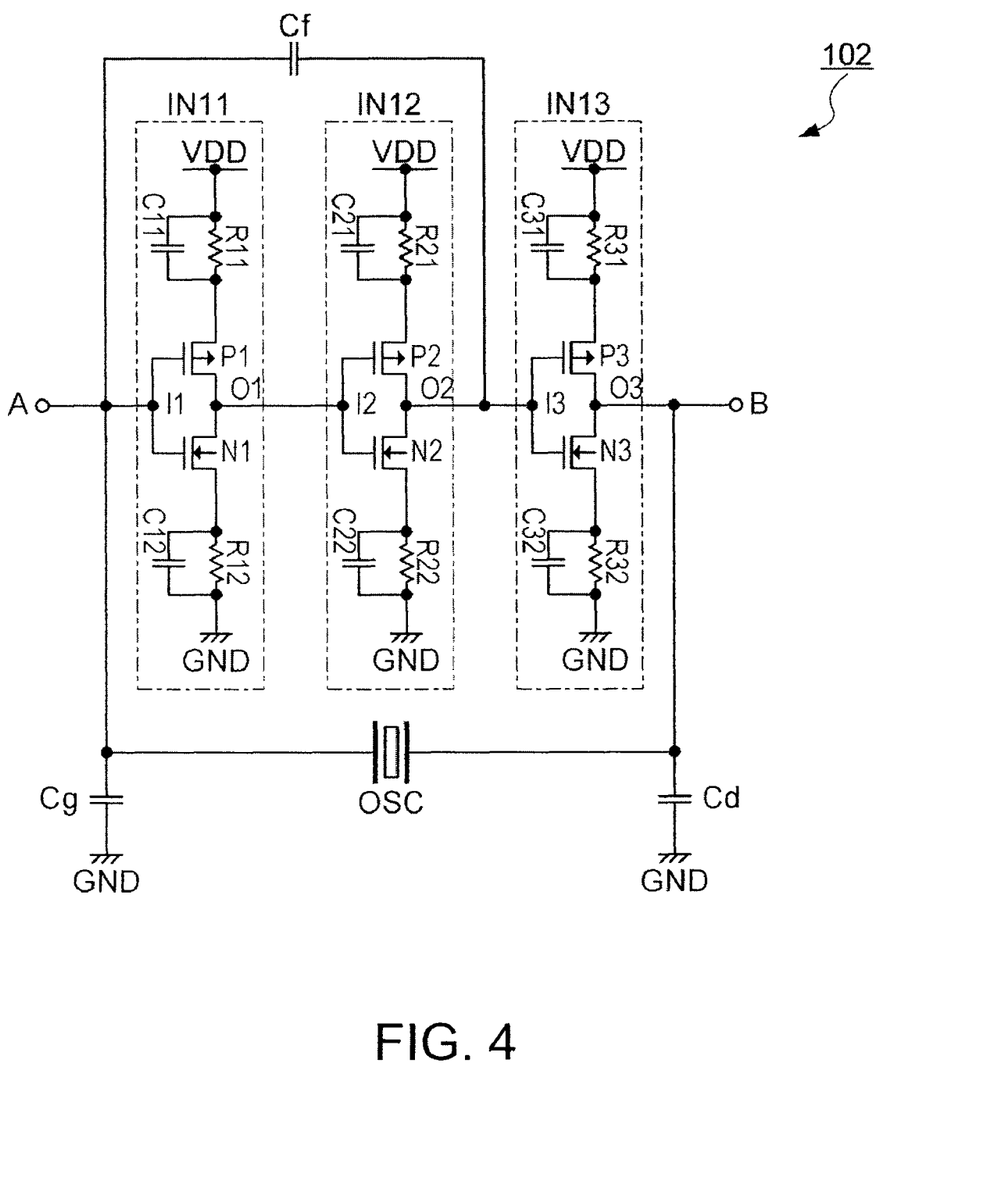
FIG. 4 is a circuit diagram showing the configuration of an oscillator circuit according to Modified Example 2.

Hereinafter, Modified Example 2 of the oscillator circuit will be described. FIG. 4 is a circuit diagram showing the configuration of an oscillator circuit 102 according to Modified Example 2. As shown in FIG. 4, in a first inverter IN11, a source terminal of an N-channel transistor N1 is connected to a ground line GND through a load element (a first load element) formed by connecting a resistor R12 and a capacitor C12 in parallel with each other, and a source terminal of a P-channel transistor P1 is connected to a voltage source line VDD through a load element (a second load element) formed by connecting a resistor R11 and a capacitor C11 in parallel with each other. Similarly, in a second inverter IN12, a source terminal of an N-channel transistor N2 is connected to the ground line GND through a load element formed by connecting a resistor R22 and a capacitor C22 in parallel with each other, and a source terminal of a P-channel transistor P2 is connected to the voltage source line VDD through a load element formed by connecting a resistor R21 and a capacitor C21 in parallel with each other. In addition, in a third inverter IN13, a source terminal of an N-channel transistor N3 is connected to the ground line GND through a load element formed by connecting a resistor R32 and a capacitor C32 in parallel with each other, and a source terminal of a P-channel transistor P3 is connected to the voltage source line VDD through a load element formed by connecting a resistor R31 and a capacitor C31 in parallel with each other.

Under the configuration described above, by adding six resistors R11 to R32, currents flowing through the inverters IN11 to IN13 can be suppressed. Accordingly, by adding six capacitors C11 to C32, the gain increases, and thus, the negative resistance is fixed. Therefore, low power consumption can be implemented.

MODIFIED EXAMPLE 3

Hereinafter, Modified Example 3 of the oscillator circuit will be described. In the first embodiment described above, although a case where the resonator OSC is configured by a SAW resonator has been described, the resonator may be configured by a tuning fork resonator, an AT resonator, a FBAR (Film Bulk Acoustic Resonator), a MEMS resonator, an SMR (Solid Mounted Resonator), or the like.

MODIFIED EXAMPLE 4

Figure 7:
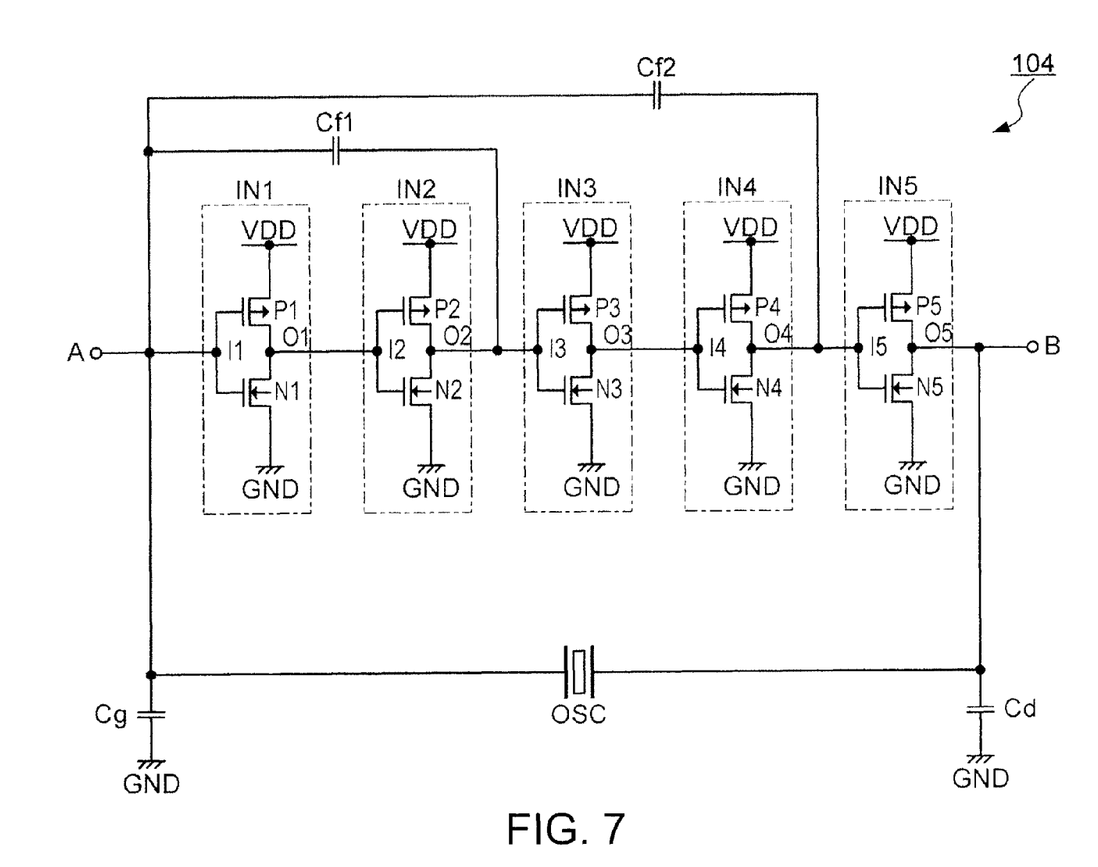
FIG. 7 is a circuit diagram showing the configuration of an oscillator circuit according to Modified Example 4.

Hereinafter, Modified Example 4 of the oscillator circuit will be described. In Modified Example 1, a case where the oscillator 101 including five inverters IN1 to IN5 as shown in FIG. 3 is used has been described. However, an oscillator 104 as shown in FIG. 7 may be used. FIG. 7 is a circuit diagram showing the configuration of an oscillator circuit according to Modified Example 4. As shown in FIG. 7, it may be configured that a third capacitor Cf1 is connected to an input terminal I1 of an inverter IN1 and an output terminal O2 of an inverter IN2 and a fourth capacitor Cf2 is connected to the input terminal I1 of the inverter IN1 and an output terminal O4 of an inverter IN4. Under the configuration described above, by adding the fourth capacitor Cf2, a frequency at which the magnitude of the negative resistance and the negative resistance become maximum can be selected in a flexible manner, compared to a case where a third capacitor is used.

MODIFIED EXAMPLE 5

Figure 8:
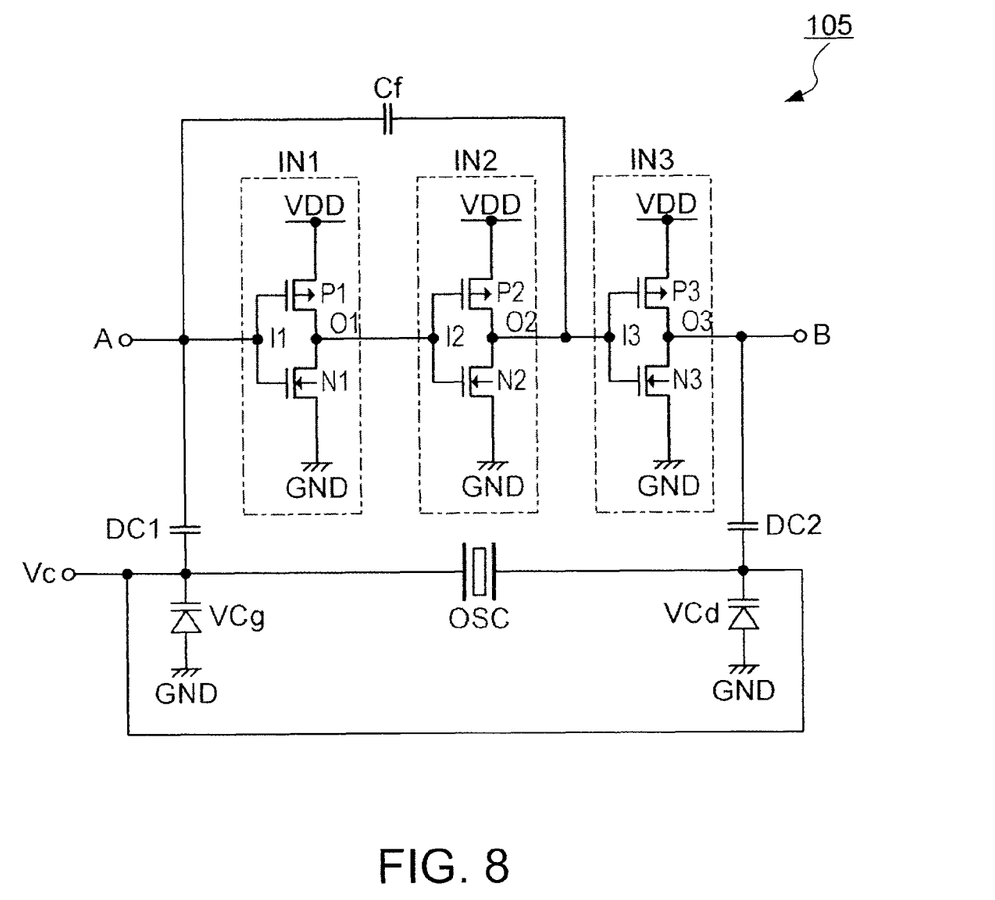
FIG. 8 is a circuit diagram showing the configuration of an oscillator circuit according to Modified Example 5.

Hereinafter, Modified Example 5 of the oscillator circuit will be described. In the first embodiment described above, a case where the first capacitor Cg and the second capacitor Cd having constant capacitance are used has been described. However, as an oscillator 105 shown in FIG. 8, variable-capacitance diodes VCg and VCd of which capacitance can be controlled by using a control voltage Vc may be used. In such a case, capacitors DC1 and DC2 for cutting off a DC component are needed to be inserted between the variable-capacitance diode VCg and the first terminal A and between the variable-capacitance diode VCd and the second terminal B.

MODIFIED EXAMPLE 6

Figure 9:
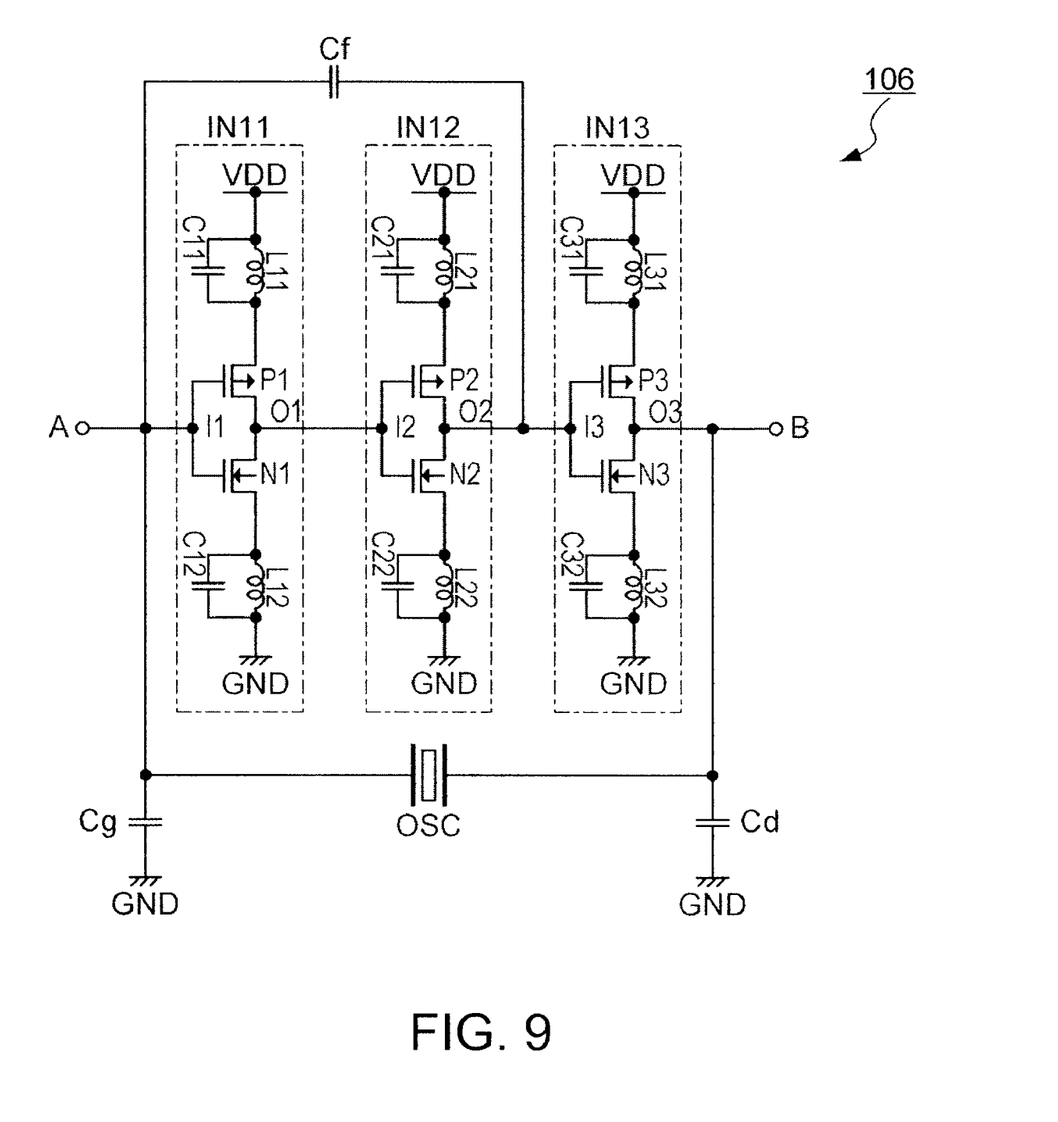
FIG. 9 is a circuit diagram showing the configuration of an oscillator circuit according to Modified Example 6.

Hereinafter, Modified Example 6 of the oscillator circuit will be described. In Modified Example 2 described above, a case where the load element formed by connecting the resistor and the capacitor in parallel with each other is used has been described. However, as an oscillator 106 shown in FIG. 9, a load element formed by connecting an inductor and a capacitor in parallel with each other may be used. In such a case, instead of the six resistors R11 to R32 shown in FIG. 4, six inductors L11 to L32 are connected.

MODIFIED EXAMPLE 7

Figure 10:
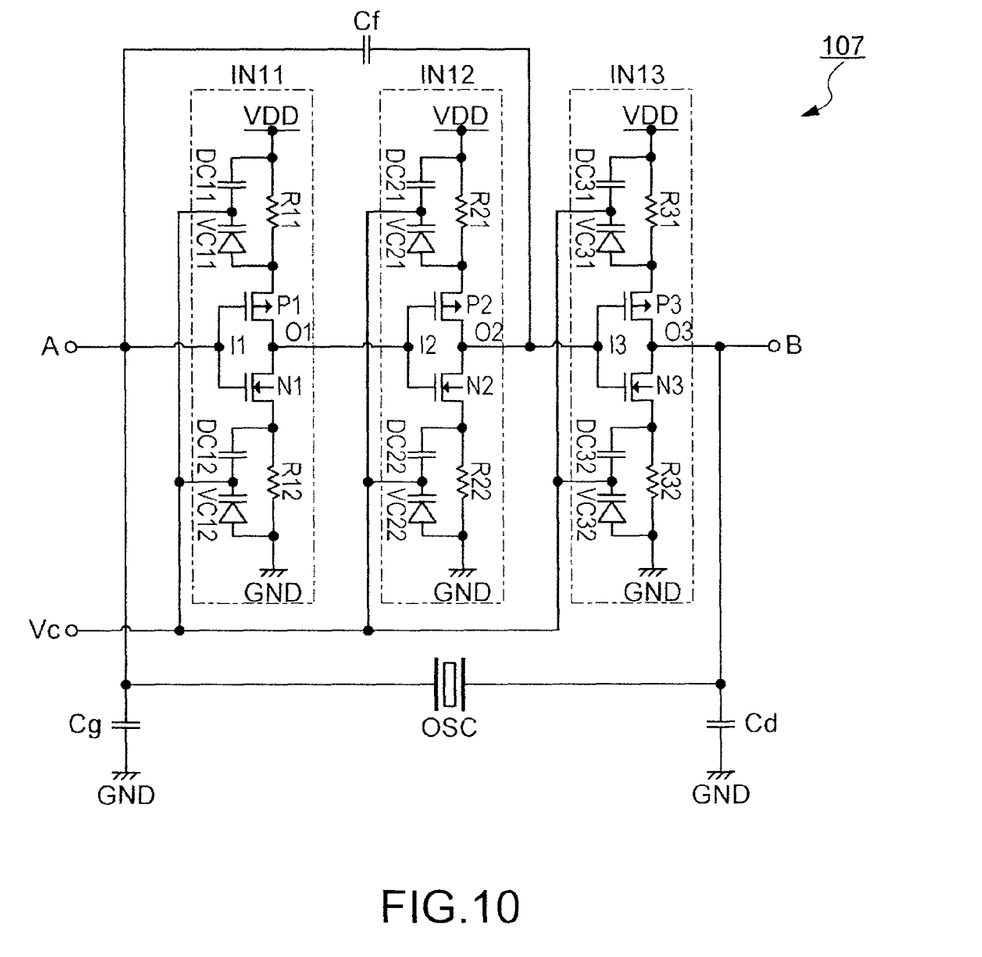
FIG. 10 is a circuit diagram showing the configuration of an oscillator circuit according to Modified Example 7.
Figure 11:
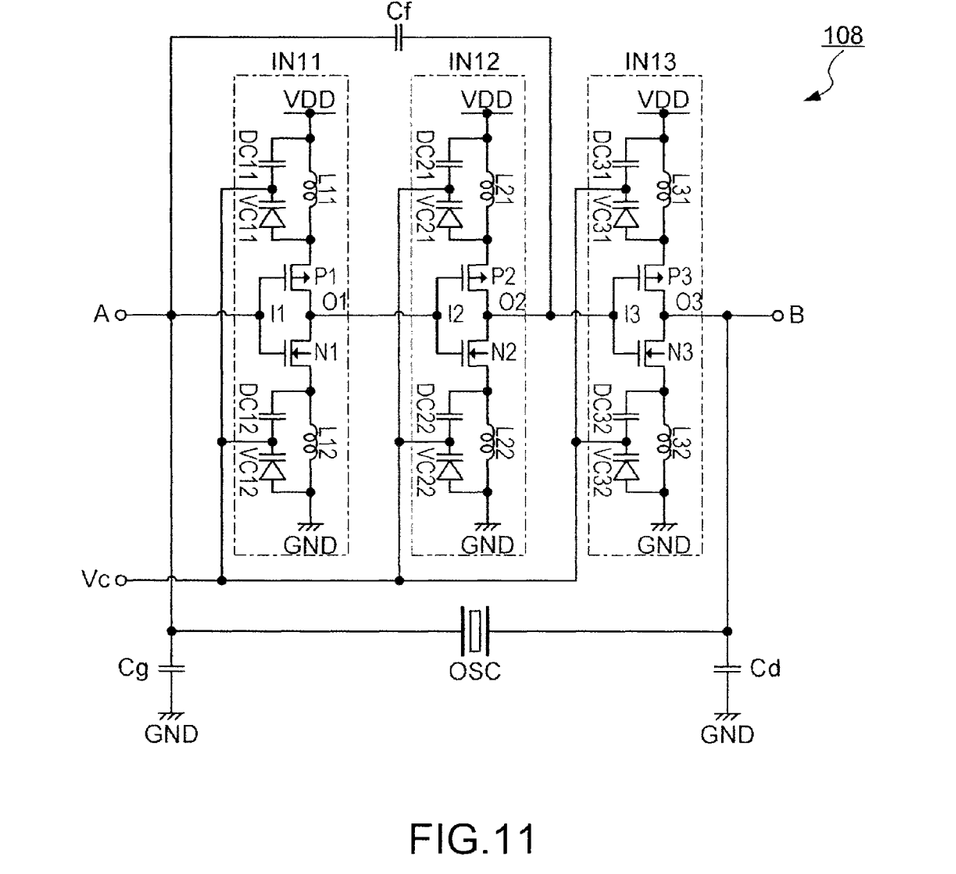
FIG. 11 is a circuit diagram showing the configuration of an oscillator circuit according to Modified Example 7.

Hereinafter, Modified Example 7 of the oscillator circuit will be described. In Modified Example 2 described above, a case where the load element formed by connecting the resistor and the capacitor in parallel with each other is used has been described. However, as an oscillator 107 shown in FIG. 10, the six capacitors C11 to C32 may be substituted with six variable-capacitance diodes VC11 to VC32 of which capacitance can be controlled by using a control voltage Vc and capacitors DC11 to DC32 for cutting off a DC component. In addition, as an oscillator 108 shown in FIG. 11, the six resistors R11 to R32 shown in FIG. 10 may be substituted with six inductors L11 to L32.

MODIFIED EXAMPLE 8

Figure 12:
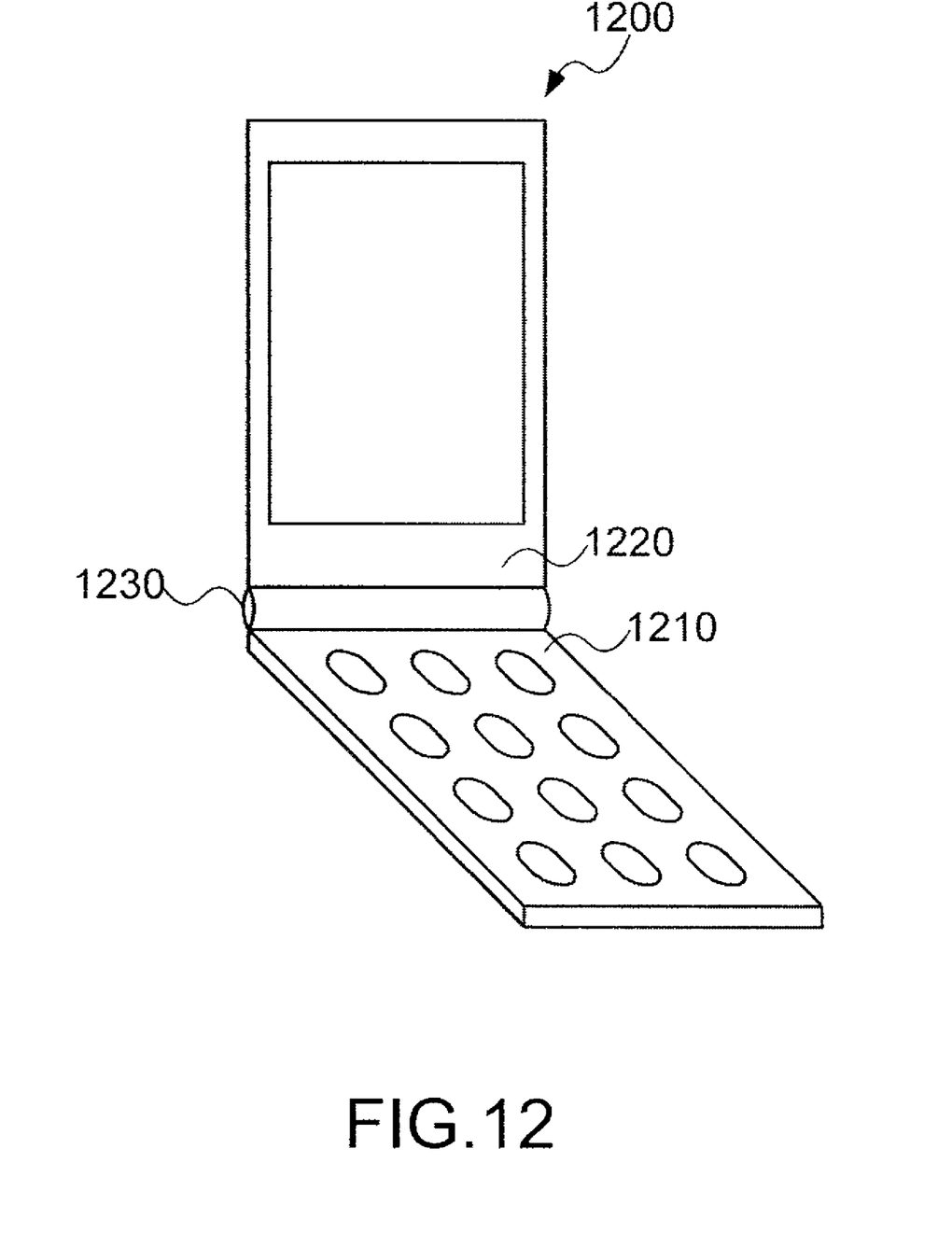
FIG. 12 is a block diagram showing the configuration of an electronic device using an oscillator circuit according to Modified Example 8.

Hereinafter, an example of an electronic device using an oscillator circuit will be described. FIG. 12 is a schematic diagram showing the configuration of a cellular phone, which is an electronic device using an oscillator circuit, according to Modified Example 8. In the cellular phone 1200, a main unit 1210 including operation buttons and the like and a display unit 1220 having a liquid crystal panel or the like are connected to be able to be folded by using a hinge part 1230. In the main unit 1210, the oscillator circuit 100 (or any one of 101, 102, and 104 to 108) is built, and a transmission circuit not shown in the figure that is controlled based on a signal output from the first or second terminal A or B of the oscillator circuit 100 is built. In the display unit 1220, a receiving circuit not shown in the figure is built. From the main unit 1210 to the display unit 1220, data such as a motion picture, a still image, or a voice is transmitted or received through wireless communication. By configuring the cellular phone 1200 using the oscillator circuit 100, the transmission circuit, and the receiving circuit, data such as a motion picture, a still image, or a voice can be transmitted at high speed from the main unit 1210 to the display unit 1220. In addition, the electronic device using the oscillator circuit 100 may be used in a wrist watch, a PDA, a remote controller, a portable music player, or the like that requires low power consumption so as to be driven by a small battery.

The entire disclosure of Japanese Patent Application No. 2008-188175, filed Jul. 22, 2008 is expressly incorporated by reference herein.

What is claimed is:

1. An oscillator circuit comprising:
   a first terminal;
   a second terminal;
   a resonator that is connected to the first terminal and the second terminal;
   a first capacitor that is connected to the first terminal and a ground line supplying the ground electric potential;
   a second capacitor that is connected to the second terminal and the ground line;
   m inverters, where m is an odd number equal to or larger than three, which are connected in series between the first terminal and the second terminal;
   a third capacitor that is connected to an input terminal of the n-th (where n is an integer satisfying $1 \leq n < m$) inverter, counted from an input side of the inverter array and an output terminal of the (n+1)-th inverter; and
   a fourth capacitor connected to the p-th (where p is an integer other than n satisfying $1 \leq p < m$) inverter, counted from the input side of the inverter array and an output terminal of the (p+1)-th inverter.

2. The oscillator circuit according to claim 1,
   wherein the m inverters respectively include a first active element and a second active element that have drain terminals connected to each other,
   a source terminal of the first active element is connected to the ground line through a first load element that is a load element formed by connecting a resistor and a capacitor in parallel with each other, and
   a source terminal of the second active element is connected to a voltage source line that supplies a source voltage through a second load element that is the load element.

3. The oscillator circuit according to claim 1,
   wherein the m inverters respectively include a first active element and a second active element that have drain terminals connected to each other,
   a source terminal of the first active element is connected to the ground line through a first load element that is a load element formed by connecting an inductor and a capacitor in parallel with each other, and
   a source terminal of the second active element is connected to a voltage source line that supplies a source voltage through a second load element that is the load element.

4. An electronic device comprising the oscillator circuit according to claim 1, wherein the electronic device is controlled based on a signal output from the first or second terminal of the oscillator circuit.

* * * * *